(12) United States Patent
Parmon

(10) Patent No.: US 10,224,255 B2
(45) Date of Patent: Mar. 5, 2019

(54) SHIELDED AND PACKAGED ELECTRONIC DEVICES, ELECTRONIC ASSEMBLIES, AND METHODS

(71) Applicant: NXP USA, Inc., Austin, TX (US)

(72) Inventor: Walter Parmon, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 214 days.

(21) Appl. No.: 15/181,731

(22) Filed: Jun. 14, 2016

(65) Prior Publication Data

US 2017/0359892 A1  Dec. 14, 2017

(51) Int. Cl.
   *H05K 1/14*   (2006.01)
   *H05K 3/34*   (2006.01)
   *H01L 23/12*  (2006.01)

(52) U.S. Cl.
   CPC .............. *H01L 23/12* (2013.01); *H05K 1/141* (2013.01); *H05K 3/3436* (2013.01); *H05K 2201/0723* (2013.01); *H05K 2201/10378* (2013.01)

(58) Field of Classification Search
   CPC ....... H01L 23/12; H05K 1/141; H05K 3/3436
   See application file for complete search history.

(56) References Cited

U.S. PATENT DOCUMENTS

| | | | |
|---|---|---|---|
| 6,578,755 B1 | 6/2003 | Elenius et al. | |
| 7,298,039 B2 | 11/2007 | Tsuyuno et al. | |
| 9,172,131 B2* | 10/2015 | Chen | H01Q 1/2283 |
| 9,842,826 B2* | 12/2017 | Lin | H01L 25/0657 |
| 2004/0159956 A1* | 8/2004 | Boone | H01L 23/552 257/778 |
| 2004/0195591 A1* | 10/2004 | Gehman | H01L 23/552 257/202 |
| 2006/0245308 A1* | 11/2006 | Macropoulos | H05K 1/024 369/1 |

(Continued)

FOREIGN PATENT DOCUMENTS

JP   2000-119629 A   4/2000

OTHER PUBLICATIONS

English-language machine translation of Japan Patent Publication No. JP 2000-119629 A, Apr. 25, 2000, 7 pages.
Press release re FlipChip International and Cookson Electronics Polymer Collar Technology Patent License Agreement, Aug. 16, 2010, 2 pages.
Reche, J. et al., "Wafer level packaging having bump-on-polymer structure," *Microelectronics Reliability*, vol. 43, Issue 6, Jun. 2003, pp. 879-894.

(Continued)

*Primary Examiner* — Nathan Milakovich

(57) ABSTRACT

Shielded and packaged electronic devices, electronic assemblies, and methods are disclosed herein. The shielded and packaged electronic devices include a packaged electronic device with a package surface and a plurality of electrically conductive package pads arranged on the package surface, a shielding dielectric layer extending in contact with the package surface and having a shielding layer surface and a plurality of openings that extends between the shielding layer surface and the plurality of electrically conductive package pads, and a plurality of electrical conductors that extends from the plurality of electrically conductive package pads and projects from the shielding layer surface. The electronic assemblies include a printed circuit board with a board surface and a plurality of electrically conductive board pads arranged on the board surface, the shielded and packaged electronic device, and an underfill dielectric layer. The methods include methods of manufacturing the electronic assemblies.

20 Claims, 4 Drawing Sheets

(56) References Cited

U.S. PATENT DOCUMENTS

| | | | | |
|---|---|---|---|---|
| 2010/0276792 | A1* | 11/2010 | Chi | H01L 23/29 |
| | | | | 257/660 |
| 2011/0193228 | A1 | 8/2011 | Yu et al. | |
| 2012/0306062 | A1* | 12/2012 | Kim | H01L 24/97 |
| | | | | 257/659 |
| 2014/0211441 | A1* | 7/2014 | Tsukizawa | H01L 22/20 |
| | | | | 361/783 |
| 2016/0284981 | A1* | 9/2016 | Bhushan | H01L 23/552 |

OTHER PUBLICATIONS

Shumway, R., "High Volume Assembly & Test Solutions to Meet the Rapidly Growing MEMS Market," Amkor Technology, a presentation from the 10$^{th}$ Annual MEMS Technology Symposium, May 23, 2012, 21 pages.

Huemoeller, R., "Amkor's SLIM & SWIFT Package Technology," Amkor Technology, a PowerPoint presentation, May 13, 2015, 19 pages.

Lee, C., "The Trend of TSV Packaging," Amkor Technology, a presentation from the SEMATECH Symposium Korea, Oct. 27-28, 2011, 24 pages.

Lee, J. et al., "Molded Underfill Development for FlipStack CSP," *2009 59$^{th}$ Electronic Components and Technology Conference*, May 26-29, 2009, pp. 954-959.

Wikipedia entry for UTAC Group (United Test and Assembly Center Ltd), 2 pages downloaded from en.wikipedia.org/wiki/UTAC_Group on Jan. 25, 2016.

\* cited by examiner

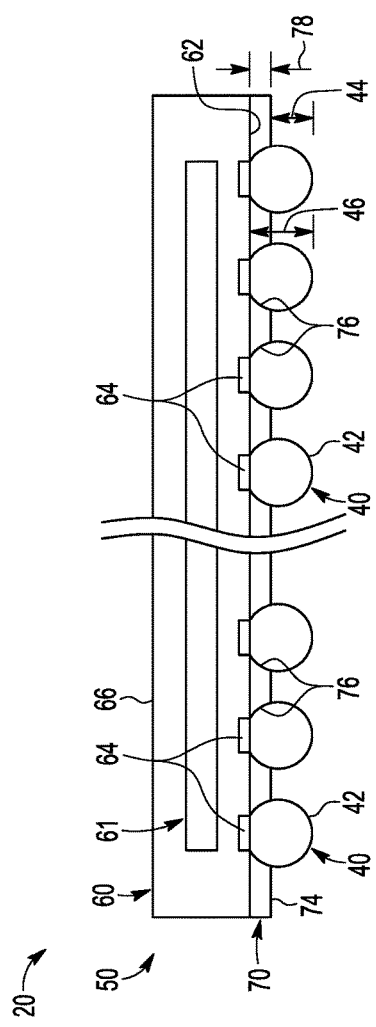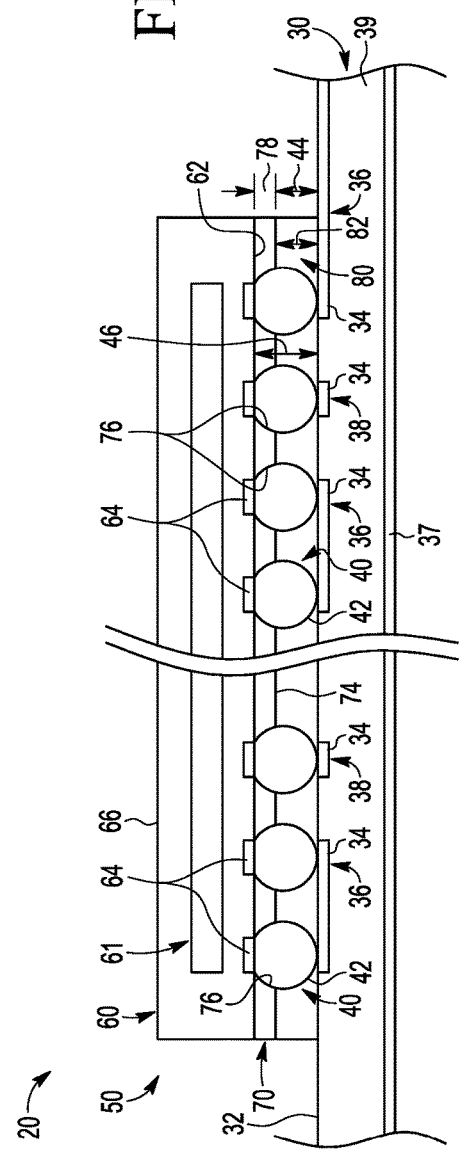

SHIELDED AND PACKAGED ELECTRONIC DEVICES, ELECTRONIC ASSEMBLIES, AND METHODS

FIELD

This disclosure relates generally to packaged electronic devices, and more specifically, to shielded and packaged electronic devices, electronic assemblies, and methods of manufacturing electronic assemblies.

BACKGROUND

Packaged electronic devices, such as integrated circuit devices encapsulated in a ball grid array package, often are surface mounted on a printed circuit board (PCB) to define an electronic assembly. In such a configuration, a plurality of electrical conductors, such as a plurality of solder balls, can be utilized to electrically and physically interconnect the packaged electronic device and the PCB. Historically, the electrical conductors have been the primary mechanism by which the packaged electronic device is affixed to the PCB.

More recently, it has become common to surface mount larger packaged electronic devices, such as those with a footprint of 6 mm by 6 mm or greater, on a PCB. In addition, and subsequent to surface mounting on the PCB, these larger packaged electronic devices often are expected to withstand hundreds, or even thousands, of thermal cycles that can extend across a temperature range of 150 degrees Celsius, or more. In such situations, the thermal stresses induced in the plurality of electrical conductors can lead to failure of one or more of the electrical conductors, rendering the electronic assembly nonfunctional.

To decrease the stress that is applied to the electrical conductors, an underfill dielectric layer can be utilized. The underfill dielectric layer can extend between the packaged electronic device and the PCB, can encapsulate the electrical conductors, or can adhere the packaged electronic device to the PCB. Thus, the underfill dielectric layer can support a portion of the thermal stresses induced by the thermal cycles, thereby improving the durability of the electronic assembly.

In practice, a wide range of different underfill layers are utilized, and these underfill layers have differing electrical properties. As an example, a dielectric constant of the underfill layers can vary between approximately 2 and 4. This variation in the electrical properties of the underfill layers can have undesired impacts on the performance of the electronic assembly. As an example, the electrical performance of receive and transmit channels within the packaged electronic device can be de-tuned, which can lead to poor signal transfer between the packaged electronic device and the PCB.

BRIEF DESCRIPTION OF THE DRAWINGS

The present invention is illustrated by way of example and is not limited by the accompanying Figures, in which like references indicate similar elements. Elements in the Figures are illustrated for simplicity and clarity and have not necessarily been drawn to scale.

FIG. 1 is a schematic representation of a shielded and packaged electronic device according to the present disclosure.

FIG. 2 is a schematic representation of an electronic assembly according to the present disclosure.

DETAILED DESCRIPTION

The shielded and packaged electronic devices, electronic assemblies, and methods disclosed herein utilize a shielding dielectric layer that extends across a package surface of a packaged electronic device. In an electronic assembly that includes the shielded and packaged electronic device, the shielding dielectric layer extends between the packaged electronic device and an underfill layer that adheres the packaged electronic device to a printed circuit board (PCB). As discussed in more detail herein with reference to FIGS. 4-5, the shielding dielectric layer functions to de-sensitize the packaged electronic device to variations in the composition, electrical properties, or dielectric constant of the underfill dielectric layer. Stated another way, the shielding dielectric layer provides a controlled, regulated, or pre-determined electrical environment near the package surface of the packaged electronic device, thereby decreasing an impact of variations in the composition of the underfill dielectric layer on the overall performance of the electronic assembly.

Figure 3:
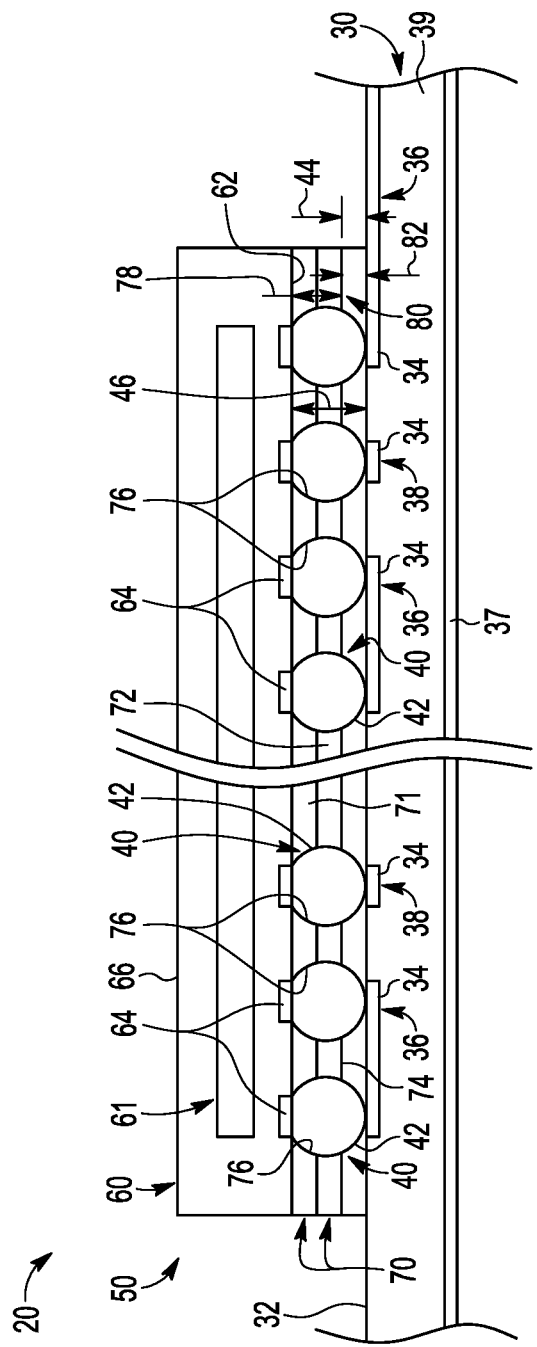
FIG. 3 is a schematic representation of an electronic assembly according to the present disclosure.

FIG. 1 is a schematic representation of a shielded and packaged electronic device 50 according to the present disclosure, while FIGS. 2-3 are schematic representations of electronic assemblies 20, according to the present disclosure, that include a printed circuit board (PCB) 30 and a shielded and packaged electronic device 50. As illustrated in FIGS. 1-3, shielded and packaged electronic devices 50 include a packaged electronic device 60. Packaged electronic device 60 includes a package surface 62 and a plurality of electrically conductive package pads 64, which are arranged on the package surface.

Shielded and packaged electronic devices 50 also include a shielding dielectric layer 70. Shielding dielectric layer 70 extends in contact with package surface 62 of packaged electronic device 60 and defines a shielding layer surface 74. Stated another way, shielding dielectric layer 70 can coat package surface 62, can cover package surface 62, can extend over package surface 62, or can extend from package surface 62.

Shielded and packaged electronic devices 50 further include a plurality of electrical conductors 40. Electrical conductors 40 extend from electrically conductive package pads 64. In addition, and as perhaps best illustrated in FIG. 1, electrical conductors 40 project from, or away from, shielding layer surface 74.

Packaged electronic device 60 can include any suitable structure that can include package surface 62 or electrically conductive package pads 64. As an example, packaged electronic device 60 can include, or be, a ball grid array package 66 that can enclose, encompass, or encapsulate an integrated circuit device 61. Under these conditions, at least a subset, or even all, of the electrically conductive package pads 64 can be in electrical communication with integrated circuit device 61 or can be configured to convey electric signals to, or from, the integrated circuit device. As illustrated in FIGS. 1-3, package surface 62 can be a flat, or planar, package surface 62.

Shielding dielectric layer 70 can include any suitable structure that can extend in contact with package surface 62, that can define shielding layer surface 74, or that can at least partially shield packaged electronic device 60 or electrical conductors 40. As an example, shielding dielectric layer 70 can shield the packaged electronic device or the electrical conductors from one or more electrical properties of an ambient environment that is proximal to packaged electronic device 60, such as the electrical properties of an underfill dielectric layer 80, which is illustrated in FIGS. 2-3. As a more specific example, the shielding dielectric layer can de-sensitize the packaged electronic device to variations in a dielectric constant of the underfill dielectric layer, as discussed in more detail herein with reference to FIGS. 4-5.

Shielding dielectric layer 70 can have or define any suitable shape, configuration, or conformation. As an example, shielding dielectric layer 70 can be conformal with, can extend conformally across, or can conformally coat, package surface 62. As another example, shielding dielectric layer 70 can be a planar shielding dielectric layer 70. Stated another way, shielding layer surface 74 can be planar, or at least substantially planar.

As illustrated in FIGS. 1-3, shielding dielectric layer 70 can include, have, or define, a plurality of openings 76. Each opening 76 extends between shielding layer surface 74 and a corresponding electrically conductive package pad 64, and a respective electrical conductor 40 extends within each opening 76.

Shielding dielectric layer 70 can have, or define, any suitable shielding layer thickness, or average shielding layer thickness, 78 that is less than a height, or average height, 46 of electrical conductors 40. As an example, and as perhaps best illustrated in FIG. 1, electrical conductors 40 can project from shielding layer surface 74 by a projection distance 44. Projection distance 44 can have any suitable value. As examples, projection distance 44 can be at least 10%, at least 20%, at least 30%, at least 40%, at least 50%, at least 75%, at least 100%, at least 150%, at least 200%, or at least 300% of shielding layer thickness 78. As additional examples, projection distance 44 can be at most 500%, at most 400%, at most 300%, or at most 200% of shielding layer thickness 78.

As another example, and as illustrated in FIGS. 2-3, electrical conductors 40 can be operatively attached to printed circuit board 30, and the printed circuit board can define a board surface 32. Under these conditions, electrical conductor height 46 also can be referred to herein as, or can be, a distance 46 between board surface 32 and package surface 62, and shielding layer thickness 78 can be any suitable fraction, or percentage, of distance 46 between the board surface and the package surface. As examples, shielding layer thickness 78 can be at least 5%, at least 10%, at least 20%, at least 30%, at least 40%, at least 50%, or at least 75% of distance 46. Additionally or alternatively, shielding layer thickness 78 can be at most 95%, at most 90%, at most 80%, at most 70%, at most 60%, at most 50%, at most 40%, or at most 30% of distance 46.

Shielding dielectric layer 70 also can include, or be formed from, any suitable material or materials. As examples, shielding dielectric layer 70 can be formed from a dielectric material, from a polymeric material, from an adhesive, from an epoxy, or from a glass. Shielding dielectric layer 70 also can be formed from a material that uniformly, or reproducibly, coats, or covers, package surface 62, as such a material can facilitate generation of a uniform, or reproducible, electrical environment proximal package surface 62.

Shielding dielectric layer 70 additionally or alternatively can be formed from a material in which openings 76 readily can be formed. As examples, shielding dielectric layer 70 can be formed from a material that is configured to be patterned to generate openings 76, that is configured to be optically patterned to generate openings 76, that is configured to be lithographically patterned to generate openings 76, or that is configured to be etched to generate openings 76.

As a more specific example, shielding dielectric layer 70 can be formed from a material that exhibits, or has, a complex dielectric constant, or relative permittivity. The relative permittivity of such a material can be described by equation (1):

$$\varepsilon = \varepsilon' + j\varepsilon'' \qquad (1)$$

where $\varepsilon$ is the relative permittivity, $\varepsilon'$ is the real component of the permittivity, j is the unit imaginary number, and $\varepsilon''$ is the imaginary component of the permittivity. Under these conditions, a loss tangent for the shielding dielectric layer can be described by equation (2):

$$\text{loss tangent} = \frac{\varepsilon''}{\varepsilon'} \qquad (2)$$

Stated another way, the loss tangent can be, or can be described as, a ratio of a loss, or lossy component, of the relative permittivity to a lossless component of the relative permittivity. When the shielding dielectric layer is formed from the material that exhibits the complex relative permittivity, the material can be selected to have a loss tangent that is less than a threshold loss tangent value. Examples of the threshold loss tangent value include threshold loss tangent values of less than 0.25, less than 0.2, less than 0.15, less than 0.1, less than 0.05, less than 0.04, less than 0.03, less than 0.025, less than 0.02, less than 0.015, or less than 0.01. Shielding dielectric layers with such low loss tangent values can absorb, or dissipate, only a small amount of electromagnetic energy from electrical signals that are conveyed through electrical conductors 40, thereby decreasing a potential for lowered signal intensity due to the presence of shielding dielectric layer 70 within shielded and packaged electronic device 50.

One or more properties of shielding dielectric layer 70 can be selected, or specified, based upon any suitable criteria. As an example, the dielectric constant or the loss tangent of the shielding dielectric layer can be selected, or specified, to control, or tune, the electrical environment near package surface 62 or to reduce variations in the electrical environment that may be caused by variations in the composition of underfill dielectric layer 80.

It is within the scope of embodiments of the present invention that shielded and packaged electronic devices 50 can include any suitable number of shielding dielectric layers 70. As an example, and as illustrated in FIGS. 1-2, shielded and packaged electronic devices 50 can include a single shielding dielectric layer 70. As another example, and as illustrated in FIG. 3, shielded and packaged electronic devices 50 can include a plurality of shielding dielectric layers 70, such as a first shielding dielectric layer 71 and a second shielding dielectric layer 72. Under these conditions, the first shielding dielectric layer can extend in contact with package surface 62, and the second shielding dielectric layer can extend between the first shielding dielectric layer and underfill dielectric layer 80 or can operatively attach the first shielding dielectric layer to the underfill layer. Shielded and packaged electronic devices 50 including more than two shielding dielectric layers 70 also are within the scope of embodiments of the present invention.

When shielded and packaged electronic devices 50 include two, or more, shielding dielectric layers 70, each shielding dielectric layer can have, or include, any suitable composition, or chemical composition. As an example, each shielding dielectric layer can have a different composition from each other shielding dielectric layer. As a more specific example, each shielding dielectric layer can have a different relative permittivity, or complex relative permittivity, from each other shielding dielectric layer. As another example, at least one shielding dielectric layer 70 can include a similar, or identical, composition to at least one other shielding dielectric layer 70. As another example, at least one shielding dielectric layer 70 can include a similar, or identical, relative permittivity, or complex relative permittivity, as at least one other shielding dielectric layer 70.

Electrical conductors 40 can include any suitable structure that can be in electrical communication with, or physically attached to, electrically conductive package pads 64, that can extend from electrically conductive package pads 64, or that can project from shielding layer surface 74. As an example, electrical conductors 40 can include a plurality of solder balls 42 and/or a plurality of copper pillars.

As discussed, shielded and packaged electronic device 60 can be operatively attached to PCB 30 to form, or define, electronic assembly 20, as illustrated in FIGS. 2-3. Electronic assembly 20 further can include underfill dielectric layer 80, which extends between shielding dielectric layer 70 and board surface 32 or operatively attaches the shielding dielectric layer to the board surface.

Printed circuit board 30 can include a plurality of electrically conductive board pads 34 arranged on board surface 32. In addition, a relative orientation of electrically conductive board pads 34 can correspond to, match, or mirror, a relative orientation of the plurality of electrically conductive package pads 64. Stated another way, the relative orientation of electrically conductive board pads 34 and the relative orientation of electrically conductive package pads 64 is such that, when shielded and packaged electronic device 50 and PCB 30 are assembled to form electronic assembly 20, each electrically conductive package pad 64 faces toward a corresponding electrically conductive board pad 34. This can include configurations in which there is a one-to-one correspondence between each electrically conductive package pad and the corresponding electrically conductive board pad, configurations in which two or more electrically conductive package pads face toward a given electrically conductive board pad, and/or configurations in which two or more electrically conductive board pads face toward a given electrically conductive package pad.

When packaged electronic device 60 and PCB 30 are assembled to define electronic assembly 20, package surface 62 can face toward, or be parallel to, board surface 32. Additionally or alternatively, each electrically conductive board pad 34 can face toward, or be parallel to, a corresponding electrically conductive package pad 64. With PCB 30 and packaged electronic device 60 in this configuration, each electrical conductor 40 can electrically and physically interconnect a given electrically conductive board pad 34 to a corresponding electrically conductive package pad 64. Stated another way, each electrical conductor 40 can be in electrical communication with both the given electrically conductive board pad and the corresponding electrically conductive package pad. Stated yet another way, and when electrical conductors 40 include solder balls 42, each solder ball 42 can be soldered to both the given electrically conductive board pad and the corresponding electrically conductive package pad.

PCB 30 can include any suitable structure that defines board surface 32 or that includes electrically conductive board pads 34. As an example, PCB 30 can include a dielectric substrate 39, and dielectric substrate 39 can support, contain, or at least partially encapsulate electrically conductive board pads 34. As another example, dielectric substrate 39 can at least partially define board surface 32, which also can be referred to herein as, or can be, a planar board surface 32. As yet another example, PCB 30 can include a board background plane 37, which can be opposed to, or on an opposed side of dielectric substrate 39 from, board surface 32.

Electrically conductive board pads 34 can include, or be, any suitable structure that can be operatively attached to electrical conductors 40, that can be in electrical communication with electrical conductors 40, or that can be soldered to electrical conductors 40. As an example, at least a subset of the plurality of electrically conductive board pads 34 can include, form a portion of, or be, a board ground plane 36. As another example, at least a subset of the plurality of electrically conductive board pads 34 can include, form a portion of, or be, a board microstrip transmission line 38. Microstrip transmission lines 38 can include, or be, single-ended port connections, as illustrated. Additionally or alternatively, microstrip transmission lines 38 can include, or be, differential port, or multi-port, connections.

Underfill dielectric layer 80 can include any suitable structure or material that can extend between and operatively interconnect shielding dielectric layer 70 and board surface 32. As examples, underfill dielectric layer 80 can include, or be formed from, one or more of a dielectric material, a polymeric material, an adhesive, an epoxy, an amorphous material, or a glass. Underfill dielectric layer 80 can include a different chemical composition than a chemical composition of shielding dielectric layer 70. However, this is not required, and the chemical composition of the underfill dielectric layer can be similar, or even identical, to the chemical composition of the shielding dielectric layer as long as the underfill dielectric layer and the shielding dielectric layer are two distinct, or separate, dielectric layers. As an example, the underfill dielectric layer and the shielding dielectric layer can be positioned within electronic assembly 20 at different times. As a more specific example, and as discussed in more detail herein with reference to methods 100 of FIG. 6, shielding dielectric layer 70 can be operatively attached to packaged electronic device 60 to form shielded and packaged electronic device 50 prior to underfill dielectric layer 80 being utilized to adhere the shielded and packaged electronic device to PCB 30. Under these conditions, the shielded and packaged electronic device can be operatively attached to the PCB, such as via electrical conductors 40, and underfill dielectric layer 80 can be a liquid underfill dielectric layer that is flowed, or wicked, into a void space between the shielding dielectric layer and the PCB and subsequently cured, or hardened, to adhere the shielding dielectric layer to the PCB.

It is within the scope of embodiments of the present invention that underfill dielectric layer 80 can have, or define, any suitable underfill layer thickness, or average underfill layer thickness, 82. As an example, underfill layer thickness 82 can be similar, or even identical, to projection distance 44 of electrical conductors 40, especially when printed circuit board 30 and shielded and packaged electronic device 50 are assembled to form electronic assembly 20. As another example, underfill dielectric layer 80 can span a distance between board surface 32 and shielding layer surface 74. As yet another example, underfill layer thickness 82 can be any suitable fraction, or percentage, of distance 46 between board surface 32 and package surface 62. As examples, underfill layer thickness 82 can be at least 5%, at least 10%, at least 20%, at least 30%, at least 40%, at least 50%, or at least 75% of distance 46. Additionally or alternatively, underfill layer thickness 82 can be at most 95%, at most 90%, at most 80%, at most 70%, at most 60%, at most 50%, at most 40%, or at most 30% of distance 46.

Figure 4:
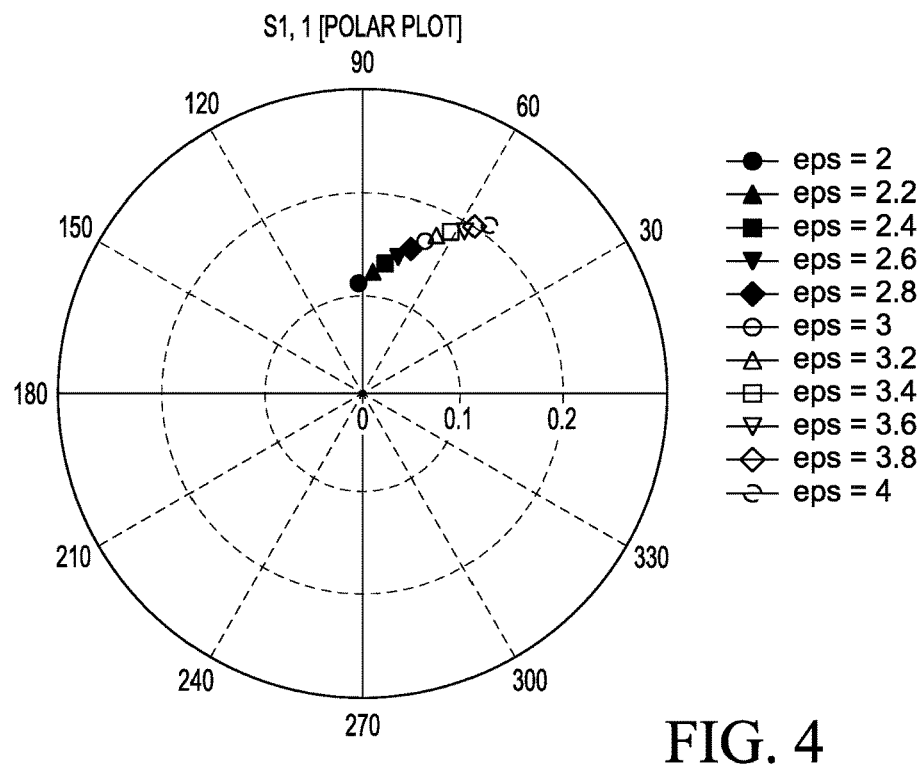
FIG. 4 is a plot depicting electromagnetic performance of a packaged electronic device that does not include a shielding dielectric layer according to the present disclosure.
Figure 5:
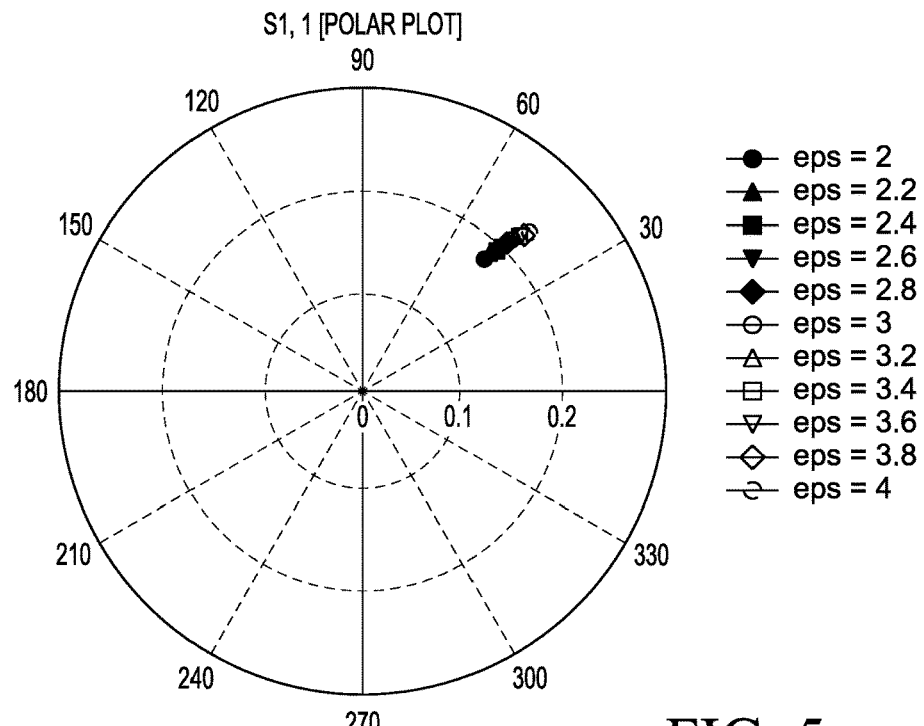
FIG. 5 is a plot depicting electromagnetic performance of a shielded and packaged electronic device according to the present disclosure.

FIGS. 4-5 illustrate reflection coefficients for a 77 GHz signal being conveyed, within an electronic assembly, from a PCB and into a packaged electronic device. In the plot of FIG. 4, the electronic assembly does not include a shielding dielectric layer according to the present disclosure, and an underfill dielectric layer extends an entirety of a distance between a board surface of the PCB and a package surface of the packaged electronic device. In the plot of FIG. 5, the electronic assembly includes both a shielding dielectric layer, which extends across the package surface and 25% of the distance between the board surface and the package surface, and an underfill dielectric layer, which extends between the shielding dielectric layer and the board surface. In both of FIGS. 4-5, the reflection coefficients are plotted for underfill dielectric layers with dielectric constants that vary between 2 and 4.

As illustrated in the comparison between FIGS. 4-5, addition of the shielding dielectric layer has a substantial impact on the reflection coefficients. More specifically, addition of the shielding dielectric layer significantly decreases a variation in the reflection coefficients with variation in the dielectric constant of the underfill dielectric layer. Thus, the presence of the shielding dielectric layer de-sensitizes, or shields, the packaged electronic device from variations in the dielectric constant of the underfill dielectric layer, thereby decreasing a potential for de-tuning of the electrical performance of the receive and transmit channels of the packaged electronic device when different underfill dielectric layers are utilized in a given electronic assembly.

As an example, the shielding dielectric layer can have a first dielectric constant and the underfill dielectric layer can have a second dielectric constant that can be different from the first dielectric constant. Under these conditions, both the shielding dielectric layer and the underfill dielectric layer can impact, or affect, the reflection coefficient for the signals that are conveyed from the PCB and into the packaged electronic device, and one or more properties of the shielding dielectric layer, such as the first dielectric constant or a thickness of the shielding dielectric layer, can be selected to decrease or minimize the reflection coefficient, or changes in the reflection coefficient due to variations in the composition of the underfill dielectric layer.

Figure 6:
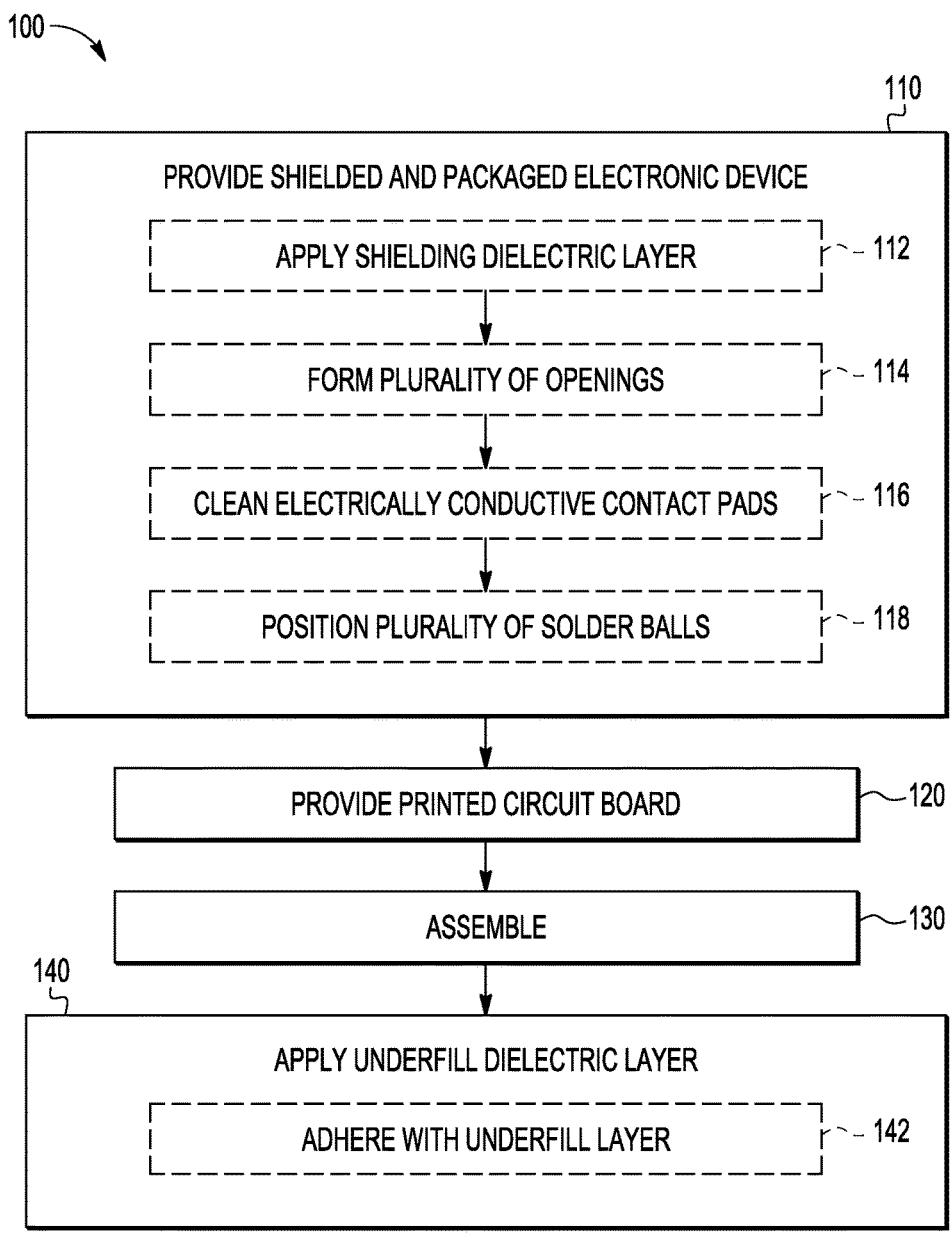
FIG. 6 is a flowchart depicting methods, according to the present disclosure, of manufacturing an electronic assembly.

FIG. 6 is a flowchart depicting methods 100, according to the present disclosure, of manufacturing an electronic assembly, such as electronic assembly 20 of FIGS. 2-3. Methods 100 include providing a shielded and packaged electronic device at 110, providing a printed circuit board at 120, assembling the shielded and packaged electronic device and the printed circuit board at 130, and applying an underfill dielectric layer at 140.

Providing the shielded and packaged electronic device at 110 includes providing any suitable shielded and packaged electronic device, such as shielded and packaged electronic device 50 of FIGS. 1-3. The shielded and packaged electronic device includes both a packaged electronic device, such as packaged electronic device 60 of FIGS. 1-3, and a shielding dielectric layer, such as shielding dielectric layer 70 of FIGS. 1-3. The packaged electronic device can include a package surface, such as package surface 62 of FIGS. 1-3, and a plurality of electrically conductive package pads, such as electrically conductive package pads 64 of FIGS. 1-3, arranged on the package surface. The shielded and packaged electronic device further can include a plurality of electrical conductors, such as electrical conductors 40 of FIGS. 1-3. The electrical conductors can extend from the electrically conductive package pads. The shielding dielectric layer can extend in contact with the package surface and can define a shielding layer surface, such as shielding layer surface 74 of FIGS. 1-3. The shielding dielectric layer can at least partially surround each electrical conductor, and each electrical conductor can project from the shielding layer surface.

The providing at 110 can be accomplished in any suitable manner. As an example, the providing at 110 can include acquiring, purchasing, specifying, or ordering the shielded and packaged electronic device. As another example, the providing at 110 can include manufacturing, fabricating, or assembling the shielded and packaged electronic device.

As a more specific example, and as illustrated in FIG. 6, the providing at 110 can include applying the shielding dielectric layer to the package surface, as indicated at 112. This can include coating the package surface with the shielding dielectric layer, such as by spin-coating, dip-coating, painting, spraying, or casting.

The providing at 110 also can include forming a plurality of openings in the shielding dielectric layer, as indicated at 114. The forming at 114 can include forming such that each opening extends between the shielding layer surface and a corresponding electrically conductive package pad. The forming at 114 also can include patterning the shielding dielectric layer, such as via any suitable optical patterning technique, lithography technique, dry etch technique, or wet etch technique, to form the openings.

The providing at 110 further can include cleaning the electrically conductive package pads, as indicated at 116, and the providing at 110 also can include positioning a respective electrical conductor, such as one of the plurality of electrical conductors 40 of FIGS. 1-3, within each of the openings. As discussed, the electrical conductor can include a solder ball or a copper pillar. The positioning also can include positioning the respective electrical conductor on a given electrically conductive package pad, as indicated at 118. Each solder ball or copper pillar can form, or define, a respective electrical conductor of the plurality of electrical conductors, and the cleaning at 116 can be performed prior to the positioning at 118.

Providing the printed circuit board at 120 can include providing any suitable printed circuit board, or PCB, in any suitable manner. As an example, the providing at 120 can include providing PCB 30 of FIGS. 2-3. The PCB can include a board surface, such as board surface 32 of FIGS. 2-3, and a plurality of electrically conductive board pads, such as electrically conductive board pads 34 of FIGS. 2-3, arranged on the board surface. A relative orientation of the plurality of electrically conductive package pads can correspond to a relative orientation of the plurality of electrically conductive board pads, as discussed herein.

The providing at 120 can be accomplished in any suitable manner. As examples, the providing at 120 can include acquiring, purchasing, specifying, or ordering the PCB. As another example, the providing at 120 can include manufacturing, fabricating, or assembling the PCB.

Assembling the shielded and packaged electronic device and the printed circuit board at 130 can include assembling such that the package surface faces toward the board surface to define a void space that extends between the shielding layer surface and the board surface. The assembling at 130 also can include electrically and physically interconnecting a given electrically conductive board pad to the corresponding electrically conductive package pad with a corresponding electrical conductor. This can include soldering the electrical conductor to the given electrically conductive board pad or to the corresponding electrically conductive package pad.

Applying the underfill dielectric layer at 140 can include applying the underfill dielectric layer to the void space. This can include applying any suitable underfill dielectric layer, such as underfill dielectric layer 80 of FIGS. 2-3, to the void space. The applying at 140 also can include applying the underfill dielectric layer such that the underfill dielectric layer extends between the shielding dielectric layer and the board surface, such that the underfill dielectric layer attaches, or operatively attaches, the shielding dielectric layer to the board surface, or such that the underfill dielectric layer adheres the shielding dielectric layer to the board surface. Thus, the applying at 140 also can include, or can be referred to herein as, adhering the shielded and packaged electronic device to the printed circuit board with the underfill dielectric layer, as indicated at 142.

Although the invention is described herein with reference to specific embodiments, various modifications and changes can be made without departing from the scope of the present invention as set forth in the claims below. For example, shielded and packaged electronic device 50 of FIG. 1 can include a plurality of shielding dielectric layers 70, as illustrated in FIG. 3. Accordingly, the specification and Figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any of the claims.

Unless stated otherwise, terms such as "first" and "second" are used to arbitrarily distinguish between the elements such terms describe. Thus, these terms are not necessarily intended to indicate temporal or other prioritization of such elements.

As used herein the terms "adapted" and "configured" mean that the element, component, or other subject matter is designed, or intended, to perform a given function. Thus, the use of the terms "adapted" and "configured" should not be construed to mean that a given element, component, or other subject matter is simply "capable of" performing a given function but that the element, component, or other subject matter is specifically selected, created, implemented, utilized, programmed, or designed for the purpose of performing the function. It is also within the scope of embodiments of the present invention that elements, components, or other recited subject matter that is recited as being adapted to perform a particular function may additionally or alternatively be described as being configured to perform that function, and vice versa.

As used herein, the term "or" should be interpreted as being inclusive or exclusive. For example, "A or B" can be interpreted to mean A, B, or both A and B.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of embodiments of the present invention.

The following are various embodiments of the present invention.

In a first embodiment, there is provided an electronic assembly. The electronic assembly includes a printed circuit board. The printed circuit board includes a board surface and a plurality of electrically conductive board pads arranged on the board surface. The electronic assembly includes a packaged electronic device. The packaged electronic device includes a package surface and a plurality of electrically conductive package pads arranged on the package surface. A relative orientation of the plurality of electrically conductive package pads corresponds to a relative orientation of the plurality of electrically conductive board pads.

The electronic assembly includes a plurality of electrical conductors. The package surface faces toward the board surface. Each electrical conductor of the plurality of electrical conductors electrically and physically interconnects a given electrically conductive board pad of the plurality of electrically conductive board pads to a corresponding electrically conductive package pad of the plurality of electrically conductive package pads.

The electronic assembly includes a shielding dielectric layer. The shielding dielectric layer extends in contact with the package surface. The electronic assembly includes an underfill dielectric layer. The underfill dielectric layer extends between and operatively attaches the shielding dielectric layer to the board surface.

The packaged electronic device can include a ball grid array package. The plurality of electrical conductors can include a plurality of solder balls or a plurality of copper pillars. The shielding dielectric layer can be conformal with the package surface. The shielding dielectric layer can be a planar shielding dielectric layer. The board surface can be a planar board surface. The package surface can be a planar package surface.

The shielding dielectric layer can include a plurality of openings. A respective electrical conductor of the plurality of electrical conductors can extend within each opening of the plurality of openings.

A shielding layer thickness of the shielding dielectric layer can be at least 5% and less than 95% of a distance between the board surface and the package surface. A loss tangent of the shielding dielectric layer can be less than 0.025.

The shielding dielectric layer can have a first dielectric constant and the underfill dielectric layer can have a second dielectric constant. The second dielectric constant can be different from the first dielectric constant. The first dielectric constant can be selected to decrease changes in a reflection coefficient for signals that are conveyed, from the printed circuit board and into the packaged electronic device, due to variation in a composition of the underfill dielectric layer.

The shielding dielectric layer can be a first shielding dielectric layer. The electronic assembly can include a second shielding dielectric layer. The second shielding dielectric layer can extend between and operatively interconnect the first shielding dielectric layer and the board surface.

A method of manufacturing the electronic assembly includes providing the printed circuit board. The method includes providing a shielded and packaged electronic device that includes the packaged electronic device and the shielding dielectric layer. The method includes assembling the shielded and packaged electronic device and the printed circuit board such that the package surface faces toward the board surface to partially bound a void space. The void space extends between a shielding layer surface of the shielding dielectric layer and the board surface. Assembling the shielded and packaged electronic device includes electrically and physically interconnecting each given electrically conductive board pad to its corresponding electrically conductive package pad with a corresponding electrical conductor of the plurality of electrical conductors. The method includes applying an underfill dielectric layer to the void space.

In a second embodiment, there is provided a method of manufacturing an electronic assembly. The method includes providing a shielded and packaged electronic device. The shielded and packaged electronic device includes a packaged electronic device. The packaged electronic device includes a package surface and a plurality of electrically conductive package pads. The plurality of electrically conductive package pads are arranged on the package surface. The shielded and packaged electronic device includes a plurality of electrical conductors. The plurality of electrical conductors extend from the plurality of electrically conductive package pads. The shielded and packaged electronic device includes a shielding dielectric layer. The shielding dielectric layer extends in contact with the package surface. The shielding dielectric layer has a shielding layer surface. The shielding dielectric layer at least partially surrounds each electrical conductor of the plurality of electrical conductors. Each electrical conductor projects from the shielding layer surface.

The method includes providing a printed circuit board. The printed circuit board includes a board surface and a plurality of electrically conductive board pads. The electrically conductive board pads are arranged on the board surface. A relative orientation of the plurality of electrically conductive package pads corresponds to a relative orientation of the plurality of electrically conductive board pads.

The method includes assembling the shielded and packaged electronic device and the printed circuit board such that the package surface faces toward the board surface to partially bound a void space. The void space extends between the shielding layer surface and the board surface. Assembling the shielded and packaged electronic device and the printed circuit board includes electrically and physically interconnecting each electrically conductive board pad of the plurality of electrically conductive board pads to a corresponding electrically conductive package pad of the plurality of electrically conductive package pads with a corresponding electrical conductor of the plurality of electrical conductors.

The method includes applying an underfill dielectric layer to the void space such that the underfill dielectric layer extends between and operatively attaches the shielding dielectric layer to the board surface. Applying the underfill dielectric layer can include adhering the shielded and packaged electronic device to the printed circuit board with the underfill dielectric layer.

Providing the shielded and packaged electronic device can include applying the shielding dielectric layer to the package surface. Providing the shielded and packaged electronic device can include forming a plurality of openings in the shielding dielectric layer. Each opening of the plurality of openings can extend between the shielding layer surface and a corresponding electrically conductive package pad of the plurality of electrically conductive package pads. Providing the shielded and packaged electronic device can include positioning a given electrical conductor of the plurality of electrical conductors within each opening of the plurality of openings. The plurality of electrical conductors can include a plurality of solder balls or a plurality of copper pillars.

Applying the shielding dielectric layer can include coating the package surface with the shielding dielectric layer. Forming the plurality of openings can include patterning the shielding dielectric layer. Prior to the positioning, the method can include cleaning the plurality of electrically conductive package pads. The cleaning can include dry etching the plurality of electrically conductive package pads.

In a third embodiment, there is provided a shielded and packaged electronic device. The shielded and packaged electronic device includes a packaged electronic device. The packaged electronic device includes a package surface. The shielded and packaged electronic device includes a plurality of electrically conductive package pads arranged on the package surface.

The shielded and packaged electronic device includes a planar shielding dielectric layer. The planar shielding dielectric layer extends in contact with the package surface. The planar shielding dielectric layer includes a shielding layer surface and a plurality of openings. Each opening of the plurality of openings extends between the shielding layer surface and a corresponding electrically conductive package pad of the plurality of electrically conductive package pads.

The shielded and packaged electronic device includes a plurality of electrical conductors. Each electrical conductor of the plurality of electrical conductors extends from a given electrically conductive package pad of the plurality of electrically conductive package pads. Each electrical conductor of the plurality of electrical conductors projects from the shielding layer surface.

The planar shielding dielectric layer can extend conformally across the package surface. The planar shielding dielectric layer can have an average shielding layer thickness. Each electrical conductor of the plurality of electrical conductors can project from the shielding layer surface a projection distance. The projection distance can be at least 50% of the average shielding layer thickness. A loss tangent of the planar shielding dielectric layer can be less than 0.025.

What is claimed is:

1. An electronic assembly, comprising:
a printed circuit board with a board surface and a plurality of electrically conductive board pads arranged on the board surface;
a packaged electronic device with a package surface and a plurality of electrically conductive package pads arranged on the package surface, wherein a relative orientation of the plurality of electrically conductive package pads corresponds to a relative orientation of the plurality of electrically conductive board pads;
a plurality of electrical conductors, wherein the package surface faces toward the board surface, and further wherein each electrical conductor of the plurality of electrical conductors electrically and physically interconnects a given electrically conductive board pad of the plurality of electrically conductive board pads to a corresponding electrically conductive package pad of the plurality of electrically conductive package pads;
a shielding dielectric layer extending in contact with the package surface, wherein a loss tangent of the shielding dielectric layer is less than 0.025; and
an underfill dielectric layer that extends between and operatively attaches the shielding dielectric layer to the board surface.

2. The electronic assembly of claim 1, wherein the packaged electronic device comprises a ball grid array package, and further wherein the plurality of electrical conductors comprises at least one of a plurality of solder balls and a plurality of copper pillars.

3. The electronic assembly of claim 1, wherein the shielding dielectric layer comprises a plurality of openings, and further wherein a respective electrical conductor of the plurality of electrical conductors extends within each opening of the plurality of openings.

4. The electronic assembly of claim 1, wherein a shielding layer thickness of the shielding dielectric layer is at least 5% and less than 95% of a distance between the board surface and the package surface.

5. The electronic assembly of claim 1, wherein the shielding dielectric layer has a first dielectric constant, and further wherein the underfill dielectric layer has a second dielectric constant that is different from the first dielectric constant.

6. The electronic assembly of claim 5, wherein the first dielectric constant is selected to decrease changes in a reflection coefficient due to variation in a composition of the underfill dielectric layer for signals that are conveyed from the printed circuit board and into the packaged electronic device.

7. The electronic assembly of claim 1, wherein the shielding dielectric layer is a first shielding dielectric layer, and further wherein the electronic assembly comprises a second shielding dielectric layer that extends between and operatively attaches the first shielding dielectric layer to the board surface.

8. A method of manufacturing the electronic assembly of claim 1, the method comprising:
providing the printed circuit board;
providing a shielded and packaged electronic device that comprises the packaged electronic device and the shielding dielectric layer;
assembling the shielded and packaged electronic device and the printed circuit board such that the package surface faces toward the board surface to partially bound a void space that extends between a shielding layer surface of the shielding dielectric layer and the board surface, wherein the assembling comprises electrically and physically interconnecting each given electrically conductive board pad to its corresponding electrically conductive package pad with a corresponding electrical conductor of the plurality of electrical conductors; and
applying an underfill dielectric layer to the void space.

9. A method of manufacturing an electronic assembly, the method comprising;
providing a shielded and packaged electronic device, wherein the shielded and packaged electronic device comprises a packaged electronic device that comprises a package surface and a plurality of electrically conductive package pads arranged on the package surface, wherein the shielded and packaged electronic device further comprises a plurality of electrical conductors extending from the plurality of electrically conductive package pads and a shielding dielectric layer extending in contact with the package surface and having a shielding layer surface, wherein the shielding dielectric layer at least partially surrounds each electrical conductor of the plurality of electrical conductors, wherein a loss tangent of the shielding dielectric layer is less than 0.025, and further wherein each electrical conductor projects from the shielding layer surface;
providing a printed circuit board, wherein the printed circuit board comprises a board surface and a plurality of electrically conductive board pads arranged on the board surface, and further wherein a relative orientation of the plurality of electrically conductive package pads corresponds to a relative orientation of the plurality of electrically conductive board pads;
assembling the shielded and packaged electronic device and the printed circuit board such that the package surface faces toward the board surface to partially bound a void space that extends between the shielding layer surface and the board surface, wherein the assembling comprises electrically and physically interconnecting each electrically conductive board pad of the plurality of electrically conductive board pads to a corresponding electrically conductive package pad of the plurality of electrically conductive package pads with a corresponding electrical conductor of the plurality of electrical conductors; and
applying an underfill dielectric layer to the void space such that the underfill dielectric layer extends between and operatively attaches the shielding dielectric layer to the board surface.

10. The method of claim 9, wherein the applying the underfill dielectric layer comprises adhering the shielded and packaged electronic device to the printed circuit board with the underfill dielectric layer.

11. The method of claim 9, wherein the providing the shielded and packaged electronic device comprises:
(i) applying the shielding dielectric layer to the package surface;
(ii) forming a plurality of openings in the shielding dielectric layer, wherein each opening of the plurality of openings extends between the shielding layer surface and a corresponding electrically conductive package pad of the plurality of electrically conductive package pads; and
(iii) positioning a given electrical conductor of the plurality of electrical conductors within each opening of the plurality of openings, wherein the plurality of electrical conductors comprises at least one of a plurality of solder balls and a plurality of copper pillars.

12. The method of claim 11, wherein the applying the shielding dielectric layer comprises coating the package surface with the shielding dielectric layer, wherein the forming the plurality of openings comprises patterning the shielding dielectric layer, and further wherein, prior to the positioning, the method further comprises cleaning the plurality of electrically conductive package pads.

13. A shielded and packaged electronic device, comprising:
- a packaged electronic device with a package surface and a plurality of electrically conductive package pads arranged on the package surface;
- a planar shielding dielectric layer extending in contact with the package surface and having a shielding layer surface and a plurality of openings, wherein a loss tangent of the shielding dielectric layer is less than 0.025, and further wherein each opening of the plurality of openings extends between the shielding layer surface and a corresponding electrically conductive package pad of the plurality of electrically conductive package pads; and
- a plurality of electrical conductors, wherein each electrical conductor of the plurality of electrical conductors extends from a given electrically conductive package pad of the plurality of electrically conductive package pads, and further wherein each electrical conductor of the plurality of electrical conductors projects from the shielding layer surface.

14. The shielded and packaged electronic device of claim 13, wherein the planar shielding dielectric layer extends conformally across the package surface.

15. The shielded and packaged electronic device of claim 13, wherein the planar shielding dielectric layer has an average shielding layer thickness, and further wherein each electrical conductor of the plurality of electrical conductors projects from the shielding layer surface a projection distance that is at least 50% of the average shielding layer thickness.

16. The electronic assembly of claim 1, wherein the packaged electronic device includes an integrated circuit device and a ball grid array package that encapsulates the integrated circuit device, wherein the ball grid array package defines the package surface and includes the plurality of electrically conductive package pads, and further wherein at least a subset of the electrically conductive package pads is in electrical communication with the integrated circuit device.

17. The method of claim 9, wherein the packaged electronic device includes an integrated circuit device and a ball grid array package that encapsulates the integrated circuit device, wherein the ball grid array package defines the package surface and includes the plurality of electrically conductive package pads, and further wherein at least a subset of the electrically conductive package pads is in electrical communication with the integrated circuit device.

18. The shielded and packaged electronic device of claim 13, wherein the packaged electronic device includes an integrated circuit device and a ball grid array package that encapsulates the integrated circuit device, wherein the ball grid array package defines the package surface and includes the plurality of electrically conductive package pads, and further wherein at least a subset of the electrically conductive package pads is in electrical communication with the integrated circuit device.

19. The method of claim 9, wherein the providing the shielded and packaged electronic device includes providing the shielded and packaged electronic device as a unit.

20. The method of claim 9, wherein the assembling is prior to the applying.

* * * * *